United States Patent
Hassan et al.

(10) Patent No.: US 11,054,318 B2
(45) Date of Patent: Jul. 6, 2021

(54) SYSTEM FOR NONDESTRUCTIVE RESIDUAL STRESS PROFILING USING INDUCTIVE SENSING

(71) Applicants: Rolls-Royce Corporation, Indianapolis, IN (US); University of Cincinnati, Cincinnati, OH (US)

(72) Inventors: Waled T. Hassan, Indianapolis, IN (US); Peter B. Nagy, Cincinnati, OH (US)

(73) Assignees: Rolls-Royce Corporation, Indianapolis, IN (US); University of Cincinnati, Cincinnati, OH (US)

( * ) Notice: Subject to any disclaimer, the term of this patent is extended or adjusted under 35 U.S.C. 154(b) by 284 days.

(21) Appl. No.: 15/919,993

(22) Filed: Mar. 13, 2018

(65) Prior Publication Data

US 2018/0364111 A1 Dec. 20, 2018

Related U.S. Application Data

(60) Provisional application No. 62/519,503, filed on Jun. 14, 2017.

(51) Int. Cl.
*G01L 1/12* (2006.01)
*G01R 27/26* (2006.01)
(Continued)

(52) U.S. Cl.
CPC ............ *G01L 1/127* (2013.01); *G01L 5/0047* (2013.01); *G01M 5/005* (2013.01);
(Continued)

(58) Field of Classification Search
CPC . G01L 1/12–127; G01L 5/0047; G01R 15/14; G01R 15/18; G01R 15/181;
(Continued)

(56) References Cited

U.S. PATENT DOCUMENTS 3,913,015 A * 10/1975 Bronaugh .............. G01R 19/15
324/127
4,659,989 A * 4/1987 Kerr ....................... G01V 3/107
324/225

(Continued)

FOREIGN PATENT DOCUMENTS

WO 9001159 A1 2/1990

OTHER PUBLICATIONS

Velicheti et al., Hall Coefficient Measurement for Residual Stress Assessment in Precipitation Hardened IN718 Nickel-Base Superalloy, Jul. 19, 2016, 20 pgs.
(Continued)

*Primary Examiner* — Huy Q Phan
*Assistant Examiner* — David B Frederiksen
(74) *Attorney, Agent, or Firm* — Shumaker & Sieffert, P.A.

(57) ABSTRACT

A system may include a first injection electrode, a second injection electrode, a first sensing coil, and a second sensing coil. The first injection electrode and the second electrode may each be configured to contact a material and conduct an alternating current through a portion of the material. The first sensing coil and a second sensing coil may each be configured to inductively sense a Hall current created by the alternating current and a magnetic field perpendicular to the alternating current. The first sensing coil and the second sensing coil may be coupled in series.

19 Claims, 3 Drawing Sheets

(51) Int. Cl.
*G01R 19/10* (2006.01)
*G01R 15/18* (2006.01)
*G01N 27/82* (2006.01)
*G01N 27/90* (2021.01)
*G01M 5/00* (2006.01)
*G01L 5/00* (2006.01)

(52) U.S. Cl.
CPC .......... *G01M 5/0083* (2013.01); *G01N 27/82* (2013.01); *G01N 27/90* (2013.01); *G01R 15/18* (2013.01); *G01R 19/10* (2013.01); *G01R 27/26* (2013.01)

(58) Field of Classification Search
CPC ........ G01R 19/10; G01R 27/02; G01R 27/26; G01N 27/82; G01N 27/90
See application file for complete search history.

(56) References Cited

U.S. PATENT DOCUMENTS

| | | | | |
|---|---|---|---|---|
| 4,881,030 | A * | 11/1989 | Stuecker | G01N 27/725 324/209 |
| 5,343,146 | A | 8/1994 | Koch et al. | |
| 6,150,809 | A * | 11/2000 | Tiernan | G01N 27/82 324/225 |
| 6,362,618 | B1 * | 3/2002 | Motz | G01R 33/07 324/225 |
| 9,857,247 | B2 * | 1/2018 | Huber | G01L 1/125 |
| 2004/0045373 | A1 * | 3/2004 | Kwun | G01L 3/102 73/862.331 |
| 2004/0056654 | A1 * | 3/2004 | Goldfine | G01N 27/9013 324/239 |
| 2005/0127931 | A1 * | 6/2005 | Karlinsey, Jr. | G01R 27/02 324/750.08 |
| 2008/0265878 | A1 * | 10/2008 | Bousquet | G01N 27/902 324/238 |
| 2009/0108839 | A1 * | 4/2009 | Ausserlechner | H01L 27/22 324/251 |
| 2013/0181701 | A1 * | 7/2013 | Galbraith | G01N 27/9006 324/232 |
| 2014/0116715 | A1 * | 5/2014 | Sipila | E21B 47/06 166/336 |
| 2014/0184210 | A1 * | 7/2014 | Campbell | G01L 3/102 324/209 |
| 2015/0308980 | A1 * | 10/2015 | Bittar | E21B 47/00 73/152.54 |
| 2016/0274060 | A1 * | 9/2016 | Denenberg | G01N 27/9046 |
| 2017/0205475 | A1 * | 7/2017 | Lindemuth | G01R 33/12 |

OTHER PUBLICATIONS

Nagy, "Electromagnetic NDA", Mar. 2011, 130 pgs.
Garcia-Martin et al. "Non-Destructive Techniques Based on Eddy Current Testing", Feb. 28, 2011, 41 pgs.
"The Potential Drop Technique & Its Use in Fatigue Testing" A Short Applications Note, Retrieved on Feb. 20, 2017, 2 pgs.
Sposito, "Advances in Potential Drop Techniques for Non-Destructive Testing", Jan. 2009, 189 pgs.
Response to Extended Search Report dated Oct. 19, 2018, from counterpart European Application No. 18161088.2, filed Jun. 13, 2019, 65 pp.
Velicheti et al., "Hall Coefficient Measurement for Residual Stress Assessment in Precipitation Hardened IN718 Nickel-Base Superalloy," AIP Conference Proceedings, vol. 1806, Feb. 16, 2017, 10 pp.
Velicheti et al., "High Frequency Hall Coefficient Measurement Using Inductive Sensing for Nondestructive Materials Characterization," NDT and E International, vol. 94, Jan. 4, 2018, pp. 109-119.
Extended Search Report from counterpart European Application No. 18161088.2, dated Oct. 19, 2018, 8 pp.
Communication pursuant to Article 94(3) EPC from counterpart EP Application No. 18161088.2 dated Apr. 1, 2020, 3 pgs.
Response to Communication pursuant to Article 94(3) EPC from counterpart EP Application No. 18161088.2 dated Apr. 1, 2020, filed Jul. 27, 2020, 21 pgs.

* cited by examiner

SYSTEM FOR NONDESTRUCTIVE RESIDUAL STRESS PROFILING USING INDUCTIVE SENSING

This application claims the benefit of U.S. Provisional Application No. 62/519,503, filed Jun. 14, 2017, which is incorporated herein by reference in its entirety.

GOVERNMENT RIGHTS

This invention was made with government support under Federal Aviation Administration grant no. 15-G-007. The government has certain rights in the invention.

TECHNICAL FIELD

The disclosure relates to electromagnetic nondestructive evaluation (NDE).

BACKGROUND

Some materials that are used in high-stress environments may be protected from crack formation and propagation through application of compressive residual stresses below surfaces of the materials. For example, shot peening, low-plasticity burnishing, and laser shock peening may create residual stresses near the surface of a material. The degree and spatial distribution of the residual stress in a material may be unknown due to variances in material properties, manufacturing processes, temperature-related effects, and other stress factors of the material. To reliably predict the remaining service life of a material, electromagnetic nondestructive evaluation (NDE) may be used to detect residual stress profiles near a surface of a material and to measure conductivity, permeability, material thickness, and for flaw detection.

SUMMARY

In some examples, a system may include a first injection electrode, a second injection electrode, a first sensing coil, and a second sensing coil. The first injection electrode and the second electrode may each be configured to contact a material and conduct an alternating current through a portion of the material. The first sensing coil and a second sensing coil may each be configured to inductively sense a Hall current created by the alternating current and a magnetic field perpendicular to the alternating current. The first sensing coil and the second sensing coil may be coupled in series.

In some examples, a method may include generating, via a first injection electrode and a second injection electrode that are contacting a portion of a material, an alternating current through the portion of the material. The method may further include generating, using a magnet, a magnetic field across the portion of the material. The method may further include inductively sensing, using a first sensing coil and a second sensing coil, a Hall current for the portion of the material. The method may further include measuring a voltage, induced by the Hall current, in the first sensing coil and the second sensing coil. The method may further include determining, from the voltage, a Hall coefficient for the portion of the material.

The details of one or more examples are set forth in the accompanying drawings and the description below. Other features, objects, and advantages of the disclosure will be apparent from the description and drawings, and from the claims.

DETAILED DESCRIPTION

Figure 1:
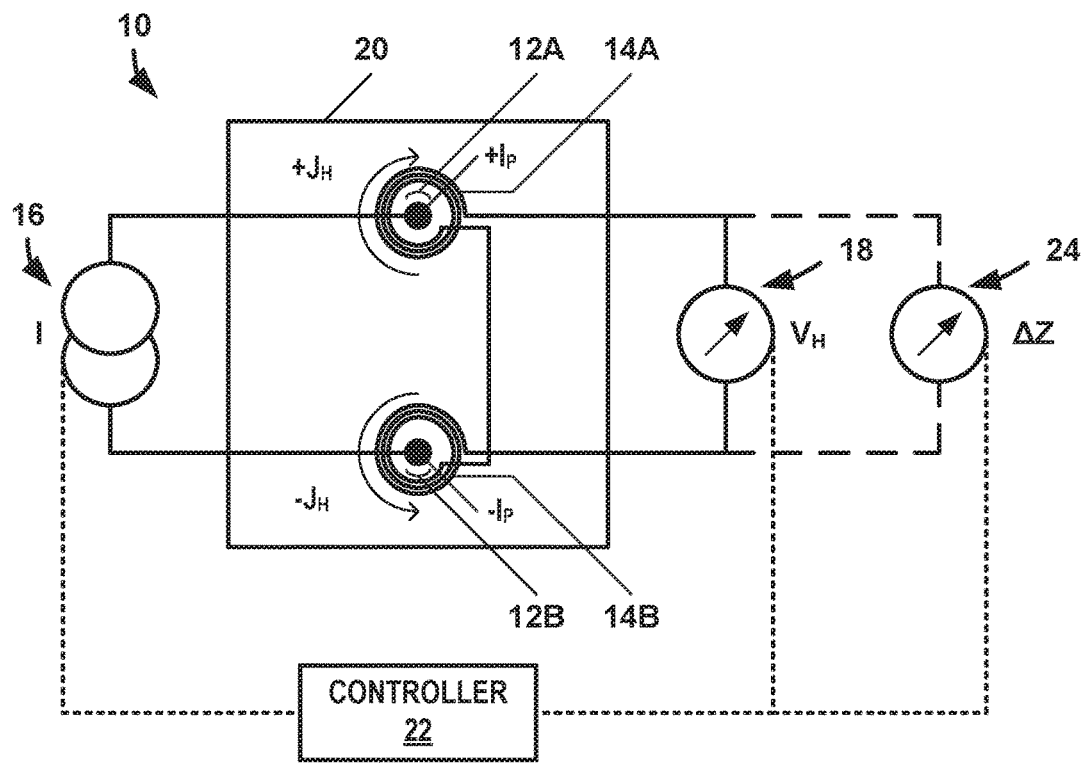
FIG. 1 is a diagram of an exemplary probe for delivering an alternating current to a material and inductively sensing a Hall current in the material.

The disclosure describes systems and techniques for determining material properties using high frequency inductive sensing of a Hall current in a material.

Residual stress in a material may be detected using a potential drop method that includes galvanically passing a current through the material and galvanically sensing a voltage generated at the surface of the material in response to the current and an external magnetic field. The voltage measured at the surface may depend on the electrical resistance between the electrodes, which may be influenced by microstructural variations such as cold work of the material. These applications may use an alternating current to control a penetrating depth of the current at the inspection frequency used. Typically, a residual stress layer is within a 500-micron depth of a surface of the material. Additionally, by using an alternating, as opposed to a direct current, the current generated during the potential drop method may flow just beneath the surface of the material and thereby generate higher potential drops in highly conductive materials.

In some applications, eddy current residual stress profiling and the Hall effect may be used to detect residual stress of a material. When an electric current passes through a material in an orthogonal magnetic field, a potential develops across the material in a direction perpendicular to the current and the magnetic field. The current may be constrained and the potential may be measured to determine a Hall coefficient of the material. The Hall coefficient of a material may be associated with particular material properties that indicate a condition and/or operating history of the material. Unlike electrical conductivity, the Hall coefficient is only sensitive to charge carrier density. Different depths may be measured based on the sensing frequency, as depth of injected alternating current is inversely proportional to the square root of frequency at high frequencies, while at low frequencies, the depth is limited by the distance between two electrodes injecting the alternating current. To determine a Hall coefficient at shallow layers, such as layers subject to surface treatment, a high frequency may be used. However, current from the injection loop may create an induced voltage in the sensing loop. This induced voltage may be suppressed at low to moderate inspection frequencies, but may not be suppressed at high frequencies used for measuring a Hall coefficient near a surface of the material.

According to principles of the disclosure, the Hall coefficient of a material may be measured using high frequency inductive sensing of a Hall current in the material. An alternating current may be galvanically supplied to a material through injection electrodes and a magnetic field may be created across the material by a magnet. Inductive sensing coils positioned adjacent the injection electrodes may sense a Hall current created by the alternating current and magnetic field. A voltage difference may be measured from the sensing coils, the Hall coefficient may be determined from the voltage difference, and properties associated with the Hall coefficient may be determined for the material. By inductively, rather than galvanically, sensing the Hall current, alternating currents having a high frequency may be used to generate the Hall current, enabling residual stress profiling at a variety of material depths in a wide variety of materials.

FIG. 1 is a diagram of an exemplary probe 10 for delivering an alternating current to a material, inductively sensing a Hall current, $J_H$, in the material, and measuring a Hall voltage, $V_H$, induced by the Hall current in a material 20. Probe 10 may be configured to be coupled to a current source 16 and voltage sensor 18, and positioned in a magnetic field. Probe 10 may be used to sense any condition that may influence the value of the Hall coefficient of material 20, including plastic deformation, hardness, and material microstructure. For example, a small or irregularly shaped sample of a material may require a compact probe for both generating a current and measuring a voltage in a material.

Probe 10 may include a first injection electrode 12A and a second injection electrode 12B (collectively referred to as "injection electrodes 12"). Each of injection electrodes 12 may be configured to couple to current source 16, contact material 20, and conduct an alternating current through material 20. Probe 10 may include a first sensing coil 14A and a second sensing coil 14B (collectively referred to as "sensing coils 14"). The first sensing coil 14A may be positioned adjacent to the first injection electrode 12A and the second sensing coil 14B may be positioned adjacent to the second injection electrode 12B. The first sensing coil 14A and the second sensing coil 14B are connected in series and wound in opposite directions, and may be coupled to voltage sensor 18.

Probe 10 may be positioned between two magnets (not shown) configured to produce a normal magnetic field, B, perpendicular to the current from injection electrodes 12. A current source may produce a current, I, that is injected through the first injection electrode 12A and the second injection electrode 12B at two points of injection, $+I_P$ and $-I_P$, respectively, to produce the current, I, through the material. When the normal magnetic field, B, is applied across the material, a first Hall current, $+J_H$, is produced at the first injection point, $+I_P$, in a first direction and a second Hall current, $-J_H$, is produced at the second injection point, $-I_P$, in a second direction opposite the first direction. The first sensing coil 14A is positioned adjacent to the first injection point, $+I_P$, and the second sensing coil 14B is positioned adjacent to the second injection point, $-I_P$. The first Hall current, $+J_H$, forms a first magnetic field to induce a first voltage in the first sensing coil 14A, while the second Hall current, $-J_H$, forms a second magnetic field, opposite the first magnetic field, to induce a second voltage in the second sensing coil 14B. The voltage difference between the first voltage and the second voltage may be detected, such as by voltage sensor 18, and may represent the Hall voltage, $V_H$.

Figure 2:
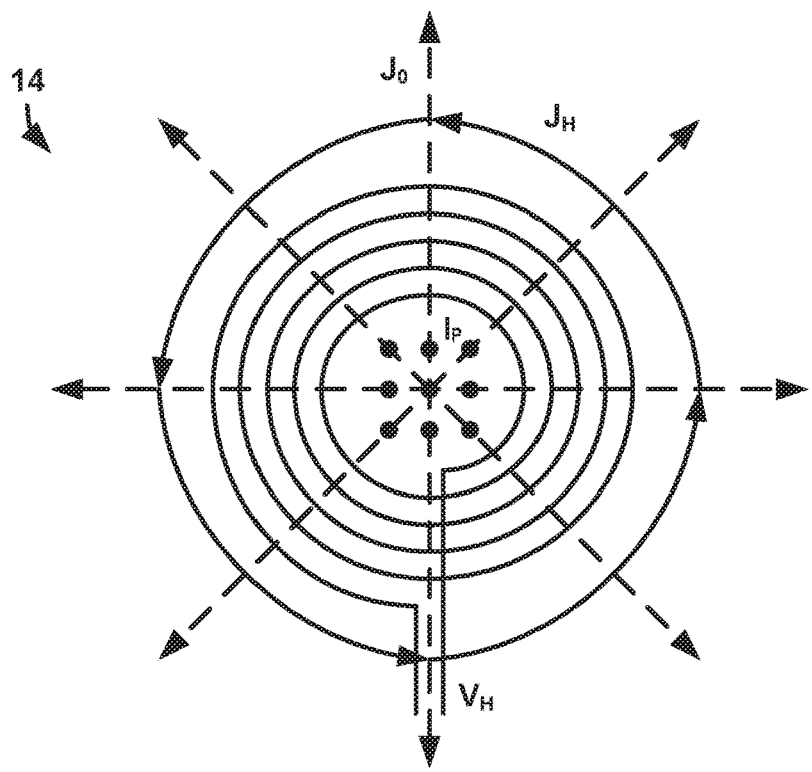
FIG. 2 is a schematic of an example sensing coil for sensing a Hall current, $J_H$, on a surface.

FIG. 2 is a schematic of an example sensing coil 14 for sensing a Hall current, $J_H$, near a surface of a material. The sensing coil 14 of FIG. 2 may be part of the probe 10 of FIG. 1 for sensing a Hall current in material 20. As mentioned above, sensing coil 14 may be positioned and configured to sense a Hall current in material 20 for measurement of a Hall voltage and subsequent determination of a Hall coefficient.

In the example of FIG. 2, the surface may be a thin plate or shallow surface layer of a material, such as material 20 of FIG. 1, at a point of current injection, I, of an injection electrode, such as one of injection electrodes 12 of FIG. 1. In the absence of a normal magnetic field, B, across the material, the total current density, J, may be represented by a conduction current $J_0$. When a normal magnetic field, B, is applied across the material, the total current density, J, may be represented by the conduction current, $J_0$, and the Hall current, $J_H$. Charge carriers moving in a radial direction away from the point of injection, I, of an alternating current form the conduction current, $J_0$, while charge carriers moving in an azimuthal direction around the point of injection, I, under the influence of Lorentz force form the Hall current, $J_H$. The Hall current, $J_H$, may be represented by Equation 1:

$$J_H = \sigma_0 R_H J_0 \times B \qquad \text{Equation 1}$$

In the above Equation 1, $J_H$ represents the vector Hall current in the material, $\sigma_0$ represents an electrical conductivity of the material, $R_H$ represents a Hall coefficient of the material, $J_0$ represents the vector conduction current in the material, and B represents the vector normal magnetic field across the material. The Hall current, $J_H$, may form a dynamic magnetic field normal to a surface to create the induced Hall voltage, $V_H$, in the sensing coil. It is this induced Hall voltage, $V_H$, that may be measured by a system such as voltage sensor 18 illustrated in FIG. 1 above. The Hall voltage, $V_H$, may be used to determine a Hall coefficient. The Hall coefficient, $R_H$, may be determined from the Hall voltage, $V_H$, such as by Equation 2 below:

$$R_H = \frac{V_H t}{BI} \qquad \text{Equation 2}$$

In the above Equation 2, $R_H$ may represent the Hall coefficient, $V_H$ may represent the Hall voltage, t may represent an effective thickness parameter of the material, B may represent the magnetic field strength, and I may represent the injected current. In the case of high frequency measurement of a Hall coefficient, $R_H$, using inductive coupling, the effective thickness parameter, t, may be calculated from the inspection frequency, f, of the probe, an electric conductivity, $\sigma_0$, of the material, a magnetic permeability, $\mu_0$, of the material, and a mutual inductance, $L_m$, between the Hall current of Equation 1 and the sensing coil. The Hall coefficient, $R_H$, may be correlated with elastic strain, plastic strain, microstructural variations, cold work, and other structural and/or phase changes to the material.

Referring back to FIG. 1, probe 10 may be coupled to controller 22, although in some examples controller 22 may be part of probe 10. Controller 22 may be coupled to voltage sensor 18 and/or current source 16. Controller 22 may be configured to receive the voltage from the voltage sensor and determine, from the voltage, a Hall coefficient, $R_H$, for the portion of the material, as shown in Equation 2 above. The Hall coefficient may be used to determine a variety of properties.

In some examples, probe 10 may be a dual-mode probe that may be configured to determine both a Hall coefficient, $R_H$, and an eddy current conductivity, $\sigma_0$, for a portion of material 20. For example, a probe having this configuration may be used to determine both an elastic strain of a material and a plastic strain of a material. Residual stress assessments may be affected by sensitivity to adverse microstructural variations from production of the residual stresses and their subsequent thermo-mechanical relaxation. A surface hardened by a cold working process may exhibit high levels of equivalent plastic strain. Elastic strain and plastic strain decay at different rates during thermo-mechanical relaxation. While elastic strain may increase the electrical conductivity of a material, an accompanying plastic strain may cancel out any differences in electrical conductivity, making electric conductivity spectroscopy unsuitable for separating elastic strain from plastic strain in these materials.

According to principles of the disclosure, the elastic strain and the plastic strain may be separated through determination of a Hall coefficient and eddy current conductivity through inductive sensing as described above. While compressive stress in surface treated components may change conductivity in opposite directions, the compressive stress may change the Hall coefficient in the same direction. Determination of a Hall coefficient and an eddy current conductivity may allow accurate and reliable separation between the residual stress of elastic strain and the cold work effects of plastic strain.

In a first mode, probe 10 may operate as described above to determine a Hall coefficient of material 20. In a second mode, probe 10 may operate to induce eddy currents in material 20 and measure changes in impedance to determine an eddy current conductivity, $\sigma_0$, for material 20.

Sensing coils 14 may be coupled to current source 16 and an impedance sensor 24. Current source 16 may generate an alternating current through sensing coils 14. The alternating current in sensing coils 14 may create a fluctuating magnetic field that induces eddy currents in material 20. The eddy currents may create a secondary magnetic field that may create a change in impedance, $\Delta Z$, in sensing coils 14.

Probe 10 may include impedance sensor 24. Impedance sensor 24 may be configured to detect the change in impedance in one or both of sensing coils 14. Impedance sensor 24 may output the change in impedance to controller 22. Controller 22 may determine a conductivity, $\sigma_0$, of the portion of material 20 from the change in impedance.

Controller 22 may determine a plastic strain and an elastic strain of the portion of the material based on the measured Hall coefficient, $R_H$, and the measured eddy current conductivity, $\sigma_0$.

$$\begin{bmatrix} y_1 \\ y_2 \end{bmatrix} = \begin{bmatrix} a_{11} & a_{12} \\ a_{21} & a_{22} \end{bmatrix} \begin{bmatrix} x_1 \\ x_2 \end{bmatrix} \quad \text{Equation 3}$$

In Equation 3 above, $y_1$ represents a measured Hall coefficient, $R_H$, $y_2$ represents a measured eddy current conductivity, $\sigma_0$, $x_1$ represents elastic strain dependent on residual stress, $\varepsilon_e$, $x_2$ represents plastic strain dependent on cold work, $\varepsilon_p$, and $$\begin{bmatrix} a_{11} & a_{12} \\ a_{21} & a_{22} \end{bmatrix}$$

represents a sensitivity matrix dependent on hardness and microstructure. When the determinant of the sensitivity matrix is not zero, $\det[a] \neq 0$, material state variables may be separable. In this manner, elastic strain from residual stress may be separated from plastic strain from cold work.

Material 20 may be any electrically conductive material. In some examples, material 20 may be a material exposed to treatments, such as precipitation hardening, plastic deformation, and thermal exposure, that create microstructural variations near a surface of material 20. For example, a mechanical part containing a hardened alloy, such as Inconel 718 (IN718), may be shot-peened to introduce beneficial compressive residual stress that protects the mechanical part from crack initiation and propagation. The compressive residual stress may cause the Hall coefficient associated with a surface of the mechanical part to change. In some examples, material 20 is an alloy that may include, but is not limited to, nickel alloys, such as IN718, IN400, Waspaloy®, Rene 41, Rene 88, and RR4000; titanium alloys such as Ti6242 and Ti6546; and the like.

Figure 3:
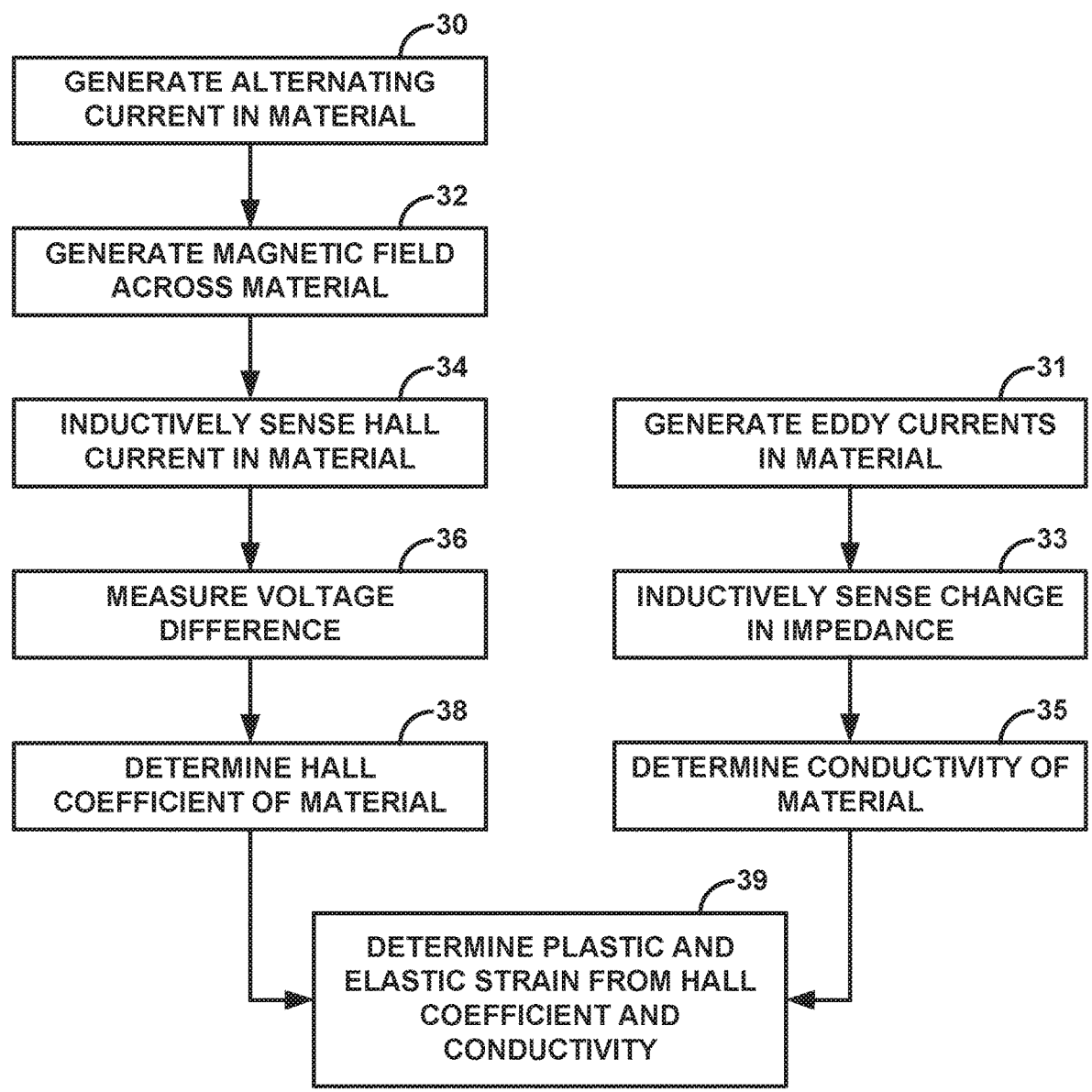
FIG. 3 is a flow diagram illustrating an example technique for nondestructively determining a Hall coefficient for a material using high frequency inductive sensing.

FIG. 3 is a flow diagram illustrating an example technique for nondestructively determining a Hall coefficient for a material using high frequency inductive sensing of a Hall current in the material. The example technique of FIG. 3 will be described with reference to probe 10 of FIG. 1; however, other systems may be used to implement the example technique of FIG. 3. Additionally, parts of the technique may be performed alone or in parallel. For example, probe 10 may determine a Hall coefficient for the material or both a Hall coefficient and a conductivity of the material.

Probe 10 may generate an alternating current in a portion of material 20 (30). For example, current source 16 may supply alternating current to injection electrodes 12 to generate an alternating current through a portion of material 20. The alternating current may have particular current characteristics, such as amplitude, frequency, phase, and the like, for effective Hall coefficient determination. Injection electrodes 12 may contact material 20 and act as source and sink electrodes for supplying the alternating current to material 20.

Probe 10 may generate a magnetic field across the portion of material 20 (32). For example, electromagnets may generate a magnetic field perpendicular to the alternating current. The magnetic field may have particular characteristics, such as magnetic field strength, magnetic field frequency, and the like. Electromagnets may be positioned on opposite sides of material 20 so that the magnetic field is substantially perpendicular to the current flow across injection electrodes 12.

Probe 10 may inductively sense a Hall current in material 20 (34). Sensing coils 14 may be positioned so that a secondary magnetic field, created by a Hall current in material 20, induces a voltage in sensing coils 14 without sensing coils 14 contacting material 20. The Hall current may induce a first voltage at a first location in a portion of material 20 and a second voltage at a second location in the portion of material 20. Sensing coils 14 may output the first voltage and the second voltage to voltage sensor 18.

Probe 10 may measure the voltage difference between the first voltage and the second voltage (36). For example, voltage sensor 18 may receive the first voltage and the second voltage from sensing coils 14 and measure a voltage difference between the first voltage and the second voltage. This voltage difference may represent the Hall voltage induced by the Hall current. Voltage sensor 18 may output a voltage signal to controller 22 that represents the Hall voltage, $V_H$.

Controller 22 may determine a Hall coefficient from the voltage difference (38). For example, the voltage difference may correspond to the Hall voltage, $V_H$. Controller 22 may receive sample information relating to the measured Hall voltage, $V_H$, a strength of the magnetic field, B, and a strength of the alternating current, I, injected into the material to determine the Hall coefficient, $R_H$, as in Equation 2 discussed above.

In some examples, probe 10 may determine one or more properties of the material based on the measured Hall coefficient. For example, controller 22 may receive Hall coefficient information that represents relationships of properties of a material with Hall coefficients. For example, dependences of the Hall coefficient on structural changes described above may be used to associate a Hall coefficient or change in a Hall coefficient with particular structural properties or structural property changes in the material. Structural properties may include, but are not limited to, hardness, elastic strain, plastic strain, stress, thermal exposure, and the like. In some examples, probe 10 may determine the Hall coefficient information by determining dependences of the Hall coefficient on structural changes, as described above. Controller 22 may receive the Hall coefficient information, as well as other information related to conditions applied to the material, such as a thermal history, a stress event history, or the like. Controller 22 may use the Hall coefficient information and the measured Hall coefficient to determine one or more properties of the material.

In some examples, probe 10 may repeat the techniques described above for a variety of conditions to determine a dependence of the Hall coefficient on structural changes caused by those conditions. For example, the Hall coefficient may be related to microstructural variations, thermo-mechanical history, plastic deformation, elastic deformation, and the like. In some examples, probe 10 may determine a Hall coefficient for more than one portion of material 20. For example, a Hall coefficient may be determined for material 20 at particular x-coordinate and/or y-coordinate spacings across a surface of material 20, such as a material of an aircraft component. Controller 22 may develop a spatial profile of Hall coefficients across the surface of material 20.

In some examples, probe 10 may be operated in dual-mode to determine a Hall coefficient and an eddy current conductivity of a portion of a material. Probe 10 may generate an alternating current in sensing coils 14 to generate eddy currents in material 20 (31). The alternating current in sensing coils 14 may create a fluctuating magnetic field that induces eddy currents in material 20. The eddy currents may create a secondary magnetic field that may create a change in impedance in sensing coils 14.

Sensing coils 14 may sense the change in impedance created by the secondary magnetic field (33). Impedance sensor 24 may detect the change in impedance from the sensing coils 14 and output the change in impedance to controller 22. Controller 22 may determine a conductivity, $\sigma_0$, of the portion of material 20 from the change in impedance (35). Controller 22 may further determine, based on the change in impedance and the Hall coefficient of the portion of material 20, an elastic strain and a plastic strain of the portion of material 20 (39), such as by Equation 3 above.

Figure 4:
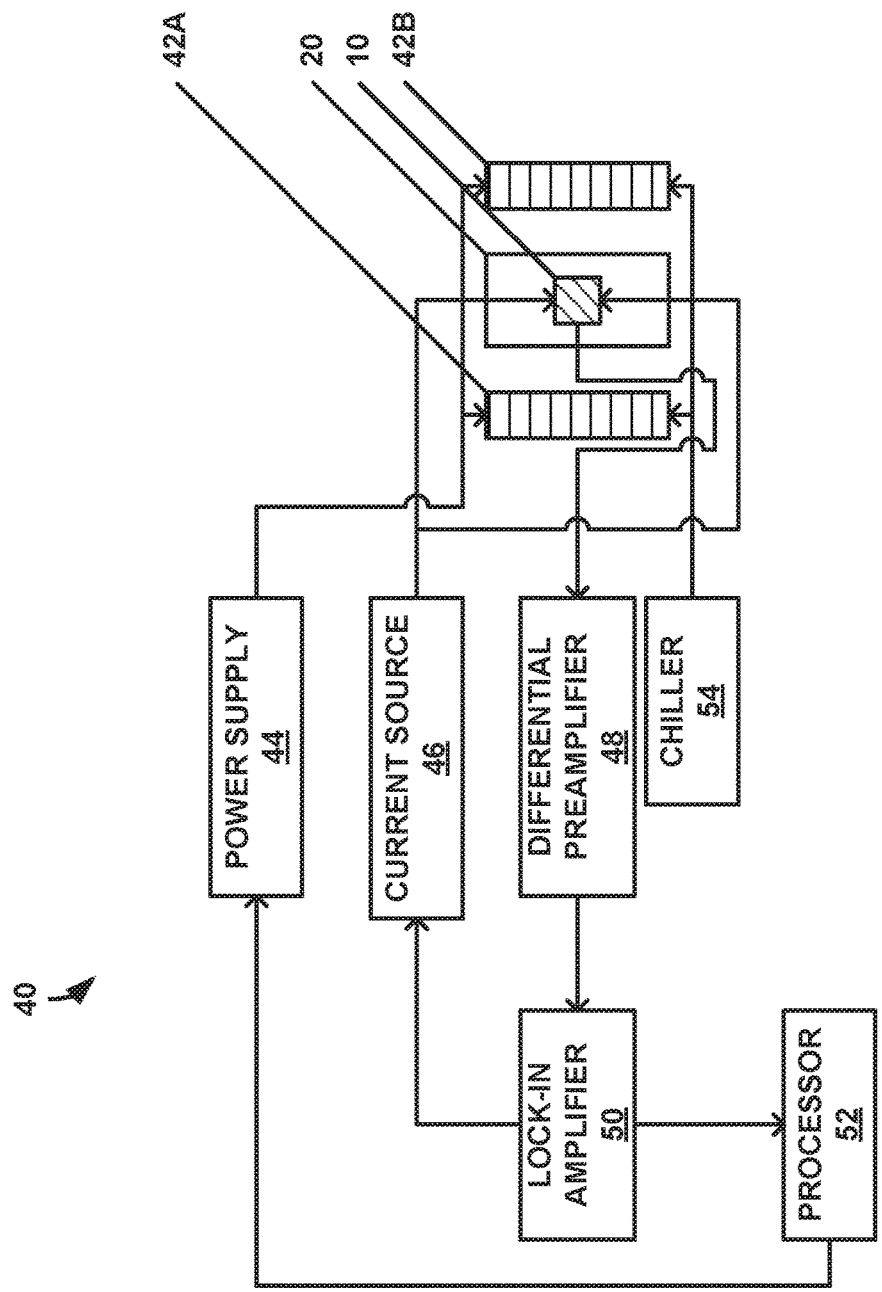
FIG. 4 is a diagram of a system 40 for nondestructively determining a Hall coefficient for a material using the probe of FIG. 1 for high frequency inductive sensing.

FIG. 4 is a diagram of a system 40 for nondestructively determining a Hall coefficient for a material 20 using probe 10 of FIG. 1 for high frequency inductive sensing. System 40 may be used to generate an alternating current in material 20, generate a magnetic field across material 20, measure a resulting voltage difference in material 20, and determine a property of material 20 from the voltage difference. System 40 may include all or part of probe 10 of FIG. 1, including controller 22 and impedance sensor 24.

System 40 may include components for generating an alternating current with particular alternating current characteristics and supplying the alternating current to material 20. In the example of FIG. 1, system 40 may include a lock-in amplifier 50, a current source 46, and injection electrode A 12A and injection electrode B 12B (collectively referred to as "injection electrodes 12") of probe 10. System 40 may generate an alternating current by first selecting alternating current characteristics such as frequency and phase, and then may supply the alternating current by galvanically contacting material 20.

Lock-in amplifier 50 may be configured to control current source 46. As discussed above, particular frequencies may be associated with detection of a Hall coefficient at corresponding surface depths. Lock-in amplifier 50 may be configured to generate a current reference signal that provides particular current characteristics, such as amplitude, frequency, phase, and the like, for effective Hall coefficient determination. Lock-in amplifier 50 may be coupled to a controller, such as a processor 52, current source 46, and a differential preamplifier 48. Lock-in amplifier 50 may be configured to send the current reference signal to current source 46 that includes the current characteristics. Lock-in amplifier 50 may include an internal oscillator configured to generate the current reference signal; alternatively, lock-in amplifier 50 may include a separate function generator for supplying a current reference signal.

Processor 52 may be configured to control various components of system 40. In the example of FIG. 4, processor 52 is coupled to power supply 44, and lock-in amplifier 50; however, other components may be coupled to processor 52. For example, processor 52 may send control signals to lock-in amplifier 50 to generate the reference control signal. Processor 52 may send control signals to, for example, power supply 44 to provide power to electromagnets 42 and hydraulic pump 70 to apply a load to material 20. Processor 52 may receive a voltage signal from lock-in amplifier 50 and a load signal from conditioning amplifier 68. Processor 52 may include any of a wide range of devices, including processors (e.g., one or more microprocessors, one or more application specific integrated circuits (ASICs), one or more field programmable gate arrays (FPGAs), or the like), one or more servers, one or more desktop computers, one or more notebook (i.e., laptop) computers, one or more cloud computing clusters, or the like.

Current source 46 may be configured to generate an alternating current for injection of the alternating current into material 20. Current source 46 may be coupled to injection electrodes 46 and lock-in amplifier 50. Current source 46 may be configured to receive a voltage signal from lock-in amplifier 50 and supply alternating current to injection electrodes 46 based on the voltage signal in order to generate an alternating current having the particular current characteristics through a portion of material 20. A variety of current sources may be used including, but not limited to, current pumps, and the like.

Injection electrodes 12 may be configured to act as source and sink electrodes for supplying an alternating current to material 20. Injection electrodes 12 may be coupled to current source 46 and positioned to create an alternating current through material 20. Injection electrodes 12 may be configured to contact material 20 and supply an alternating current across a portion of material 20. A variety of injection electrodes may be used including, but not limited to, spring-loaded electrodes, surface welded/soldered electrodes, and the like.

System 40 may include components for generating a magnetic field across material 20. In the example of FIG. 4, system 40 may include electromagnet 42A and electromagnet 42B (collectively referred to as "electromagnets 42"), power supply 44, and chiller 54. In the example of system 40, an electromagnetic field may be generated through electromagnets 42; however, in other examples, a permanent magnetic field may be generated. For example, a permanent magnet may be used in place of electromagnets 42, and power supply 44 and chiller 54 may be eliminated.

Power supply 44 may be configured to generate power for electromagnets 42. Power supply 44 may be coupled to a controller, such as processor 52, and electromagnets 42. Power supply 44 may be configured to receive control signals from processor 52 that include power supply parameters, such as current strength and frequency, for achieving particular magnetic field characteristics, such as magnetic field strength, magnetic field frequency, and the like. Power supply 44 may be configured to supply alternating current to electromagnets 42 based on the control signals from processor 52. A variety of power supplies may be used including, but not limited to, inductive power supplies, and the like.

Electromagnets 42 may be configured to generate a magnetic field from an alternating current. Electromagnets 42 may be coupled to power supply 44 and positioned on opposite sides of material 20 so that the magnetic field is substantially perpendicular to the current flow across injection electrodes 46. Electromagnets 42 may receive alternating current from power supply 44. Chiller 54 may be configured to cool electromagnets 42. Chiller 54 may be coupled to electromagnets 42, such as through cooling channels or a cooling jacket, and a controller, such as processor 52. Chiller 54 may be configured to receive control signals from the controller and supply cooling fluid to electromagnets 42.

System 40 may include equipment for inductively sensing a Hall current in material 20. In the example of FIG. 4, system 40 may include sensing coils 14 of probe 10. Sensing coils 14 may be configured to inductively sense a Hall current in material 20. Sensing coils 14 may be coupled to sensing components, such as differential preamplifier 48, and positioned so that a secondary magnetic field, created by a Hall current in material 20, induces a voltage in sensing coils 14 without sensing coils 14 contacting material 20. Sensing coils 14 may output a first voltage and a second voltage to differential preamplifier 48. A variety of sensing coils may be used including, but not limited to, air coil sensors, ferromagnetic sensors, and the like. Sensing coils 14 may be small coils with diameters of about 40 mm or less. In some examples, sensing coils may have a transfer impedance greater than about 40 nΩ. For example, sensing coils 14 may not contact material 20, so that common mode potential is suppressed and relatively larger transfer impedances may be used in sensing coils 14.

System 40 may include equipment for measuring a voltage difference of induced voltages in sensing coils 14 of probe 10. In the example of FIG. 4, system 40 may include a voltage sensor in the configuration of a lock-in amplifier 50 and a differential preamplifier 48.

Differential preamplifier 48 may be configured to amplify the first and second voltages from sensing coils 14. The Hall voltage induced in sensing coils 14 is typically weak and may require preamplification for adequate measurement. Differential preamplifier 48 may be coupled to sensing coils 14 and voltage difference measurement components, such as lock-in amplifier 50. Differential preamplifier 48 may receive the first and second voltages from sensing coils 50 and output amplified first and second voltages signals to lock-in amplifier 50.

Lock-in amplifier 50, described above in relation to current generation, may act as a voltage sensor and be configured to measure a voltage difference from differential preamplifier 48. As mentioned above, lock-in amplifier 50 may be configured to generate a current reference signal. Lock-in amplifier 50 may be configured for phase-sensitive detection and synchronized to detect a voltage at a frequency of the current reference signal. Lock-in amplifier 50 may be configured to receive the first and second voltage signals from differential preamplifier 48 and output a voltage signal to processor 52 that represents the Hall voltage, $V_H$. In some examples, an alternating current resistance bridge may be used in place of lock-in amplifier 50.

In some examples, processor 52 may be configured to determine a Hall coefficient based on the voltage difference signal. For example, processor 52 may be coupled to an outside system, such as controller, and configured to receive Hall coefficient information that represents relationships of properties of a material with Hall coefficients. Processor 52 may receive the Hall coefficient information, as well as other information related to conditions applied to the material, such as a thermal history, a stress event history, or the like. Processor 52 may use the Hall coefficient information and the measured Hall coefficient to determine one or more properties of the material.

System 40 may also include equipment for applying and measuring a load on material 20 (not shown). System 40 may include a load frame configured to support an applied load, such as tensile stress or compressive load, a hydraulic pump configured to apply the load, and a load cell configured to measure the applied load to material 20. An isolation table may be configured to suppress mechanical vibrations that could interfere with the equipment of system 40.

System 40 may be used to nondestructively determine a Hall coefficient for a material using high frequency inductive sensing. The high frequency sensing capability of system 40 may enable measurement of Hall coefficients for shallow, subsurface layers of a material that contain compressive stress. These Hall coefficient measurements may be used for residual stress depth profiling of the material.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A system, comprising:
a first injection electrode and a second injection electrode each configured to contact a material and conduct an alternating current through a portion of the material, wherein the first injection electrode is configured to contact the material at a first injection point and the second injection electrode is configured to contact the material at a second injection point;
a first sensing coil configured to inductively sense a first Hall current at the first injection point as a first voltage;
a second sensing coil configured to inductively sense a second Hall current at the second injection point as a second voltage; and
a voltage sensor coupled to the first sensing coil and the second sensing coil, wherein the voltage sensor is configured to measure a voltage difference, induced by the Hall current in the portion of the material, between the first voltage from the first sensing coil and the second voltage from the second sensing coil,
wherein each of the first and second Hall currents is created by the alternating current and a magnetic field perpendicular to the alternating current, the first sensing coil and the second sensing coil being coupled in series.

2. The system of claim 1, further comprising a magnet positioned to generate the magnetic field perpendicular to the alternating current.

3. The system of claim 1, wherein the first sensing coil is adjacent the first injection point and the second sensing coil is adjacent the second injection point.

4. The system of claim 1, wherein the first sensing coil and the second sensing coil are wound in opposite directions.

5. The system of claim 1, further comprising a current source coupled to the first injection electrode and the second injection electrode and configured to generate the alternating current.

6. The system of claim 1, wherein the first sensing coil and the second sensing coil each have a transfer impedance greater than about 40 nΩ.

7. The system of claim 1, further comprising a controller coupled to the voltage sensor and configured to determine, from the voltage difference, a Hall coefficient for the portion of the material.

8. The system of claim 7, wherein at least one of the first sensing coil and the second sensing coil is further configured to:
generate eddy currents in the material; and
sense a change in impedance in the material based on the eddy currents.

9. The system of claim 8, further comprising an impedance sensor configured to detect the change in impedance in the material.

10. The system of claim 9, wherein the controller is coupled to at least one of the first sensing coil and the second sensing coil and further configured to:
determine a conductivity of the material based on the change in impedance in the material; and
determine an elastic strain and a plastic strain of the material based on the Hall coefficient and the conductivity.

11. A method, comprising:
generating, via a first injection electrode and a second injection electrode that are contacting a portion of a material, an alternating current through the portion of the material, wherein the first injection electrode is contacting the material at a first injection point and the second injection electrode is contacting the material at a second injection point;
generating, using a magnet, a magnetic field across the portion of the material;
inductively sensing, using a first sensing coil, a first Hall current in the portion of the material as a first voltage;
inductively sensing, using a second sensing coil, a second Hall current in the portion of the material as a second voltage;
measuring, from the first sensing coil and the second sensing coil, a voltage difference induced by the first Hall current and the second Hall current; and
determining, from the voltage difference, a Hall coefficient for the portion of the material.

12. The method of claim 11, wherein the magnetic field is generated perpendicular to the alternating current.

13. The method of claim 11, wherein the first sensing coil is adjacent the first injection point and the second sensing coil is adjacent the second injection point.

14. The method of claim 11, wherein the alternating current has a frequency greater than or equal to 1 MHz.

15. The method of claim 11, further comprising:
receiving Hall coefficient information representing one or more properties of the material; and
determining one or more properties of the material based on the Hall coefficient and the Hall coefficient information.

16. The method of claim 11, further comprising:
generating, using at least one of the first sensing coil or the second sensing coil, eddy currents in the material; and
sensing, using at least the one of the first sensing coil or the second sensing coil, a change in impedance in the material based on the eddy currents.

17. The method of claim 16, further comprising determining, from the change in impedance, a conductivity of the material.

18. The method of claim 17, further comprising determining, based on the Hall coefficient and the conductivity, an elastic strain and a plastic strain of the material.

19. A non-transitory computer-readable storage medium comprising instructions that, when executed, cause at least one processor of a system to:
cause a first injection electrode and a second injection electrode that are contacting a portion of a material to generate an alternating current through the portion of the material, wherein the first injection electrode is contacting the material at a first injection point and the second injection electrode is contacting the material at a second injection point;
cause a magnet to generate a magnetic field across the portion of the material;
receive a voltage difference induced by a first Hall current and a second Hall current and measured from a first sensing coil and a second sensing coil, wherein the first sensing coil inductively senses the first Hall current in the portion of the material as a first voltage, and wherein the second sensing coil inductively senses the second Hall current in the portion of the material as a second voltage; and
determine, from the voltage difference, a Hall coefficient for the portion of the material.

* * * * *